United States Patent [19]

Singh

[11] 4,404,734

[45] Sep. 20, 1983

[54] METHOD OF MAKING A CDS/CU$_x$S PHOTOVOLTAIC CELL

[75] Inventor: Vijay P. Singh, El Paso, Tex.

[73] Assignee: Photon Power, Inc., El Paso, Tex.

[21] Appl. No.: 404,239

[22] Filed: Aug. 2, 1982

Related U.S. Application Data

[62] Division of Ser. No. 201,588, Oct. 28, 1980, Pat. No. 4,362,896.

[51] Int. Cl.$^3$ ............................................. H01L 31/18
[52] U.S. Cl. ....................................... 29/572; 427/74; 427/87; 427/88; 148/1.5
[58] Field of Search ................ 29/572; 427/74, 87–89; 136/258 PC, 260, 265; 357/30; 148/1.5

[56] References Cited

U.S. PATENT DOCUMENTS 3,880,633  4/1975  Jordan et al. ............................ 65/60
4,159,914  7/1979  Jordan et al. ........................ 136/258
4,234,353  11/1980  Donaghey ............................ 136/258

OTHER PUBLICATIONS

A. N. Casperd et al., "Dry Barrier Formation of Cu$_2$S-CdS Junctions," *Proceedings, Int'l Photovoltaic Solar Energy Conf.*, Luxembourg (1977), Reidel Pub. Co., (1978), pp. 1131–1140.
M. S. Tomar et al., "A Comparative Study of Cu$_2$S-Zn$_x$Cd$_{1-x}$S and Cu$_2$S-CdS Thin Film Solar Cells Prepared by Solid State Reaction", *Jap. J. Appl. Physics*, vol. 19 (1980), Supplement 19-1, pp. 567–571.
S. Martinuzzi et al., "CdZnS-CdS Bifilm Solar Photocells," *Thin Solid Films*, vol. 51, pp. 211–217 (1978).
L. W. Chow et al., "Cu$_x$S/Cd$_y$Zn$_{1-y}$S and Cu$_x$S/Cd$_y$Zn$_{1-y}$S, CdS Thin Film Solar Cells Using Chemically Sprayed Films," *J. Phys. D:Appl. Phys.* vol. 14, pp. 463–469 (1981).

*Primary Examiner*—Aaron Weisstuch
*Attorney, Agent, or Firm*—Ray G. Wilson

[57] ABSTRACT

A photovoltaic cell is formed by combining a spray process, forming a crystalline layer containing cadmium and sulfur, and an evaporation process, depositing copper chloride for converting to Cu$_x$S. The crystals containing cadmium and sulfur are heated in an atmosphere of cadmium and chlorides to obtain crystals having at least one dimension greater than 0.5 micron and a planar layer of Cu$_x$S is formed on the large crystals. A layer of Cu$_x$S having a thickness of 0.5–1.0 micron is obtained. Electrodes are formed from evaporated gold or chromium or a metallic paste including silver or copper. Zn$_x$Cd$_{1-x}$S may be substituted for CdS through at least part of the crystalline layer for improved Voc.

20 Claims, No Drawings

METHOD OF MAKING A CDS/CU$_x$S PHOTOVOLTAIC CELL

This is a divisional of application Ser. No. 201,588, filed Oct. 28, 1980, now U.S. Pat. No. 4,362,896.

FIELD OF INVENTION

This invention is related to photovoltaic cells and, more particularly, to photovoltaic cells having cadmium sulfide-type material as a semiconductor and cuprous sulfide forming the heterojunction.

BACKGROUND OF INVENTION

Cadmium sulfide (CdS)-type photovoltaic cells have shown considerable promise for terrestrial photovoltaic applications. Depositing the CdS-type layer by spray pyrolysis appears to provide a process which is adaptable to low cost and large scale production of photovoltaic cells. Using the process described by Jordan and Lampkin in U.S. Pat. Nos. 3,880,633, 3,902,920, and 4,159,914, the spray process can produce very thin films of CdS in the order of 2–4 microns in thickness.

In order to produce a photovoltaic cell, a portion of the CdS layer is converted to cuprous sulfide (Cu$_x$S) to form the heterojunction, or barrier layer, where the energy conversion occurs. It is generally taught in the prior art that forming the Cu$_x$S layer is preferably accomplished by dipping the CdS film into a solution of copper ions, where the conversion is obtained by an ion conversion process. The dip solution can penetrate along CdS grain boundaries and convert sufficient CdS wherein acceptable open circuit voltages (Voc) and short circuit currents (Isc) are obtained. However, the dip solution can penetrate through the entire CdS layer along grain boundaries or through pin-hole defects in the CdS layer, wherein the CdS layer is short circuited and the photovoltaic effect is inoperative.

One solution proposed in U.S. Pat. No. 4,159,914 is to provide a bi-layered CdS structure. The first layer of CdS is formed on a transparent electrically conductive substrate and is formed with a crystal structure which resists penetration of the dip solution. The first layer of CdS is generally formed with small sized crystals, less than 0.10 microns, and may be amorphous in appearance. The second CdS layer is conventionally formed of CdS crystals having dimensions in the range of 0.1–1.0 microns. The bi-layered CdS cell permits a process yielding a high percentage of operable photovoltaic cells.

However, the bi-layered cell obtains only relatively low Voc. Although current densities of up to 26 ma/cm$^2$ have been obtained from the bi-layered cell, which is close to a theoretical limit, maximum Voc of only about 440–460 mv have been observed. It is theorized that the penetrating dip solution forms a heterojunction with the small crystals in the first CdS layer along the interface between the two layers. The Voc of a single crystal is believed to be a function of the crystal size, wherein the small first layer crystals produce relatively small open circuit voltage. Thus, the first layer open circuit voltage would be less than the second layer open circuit voltage, wherein the overall cell open circuit voltage would be reduced.

One solution to the low open circuit voltage problem is to use a weak dip solution, where copper ions do not penetrate to the interface to form heterojunctions with the first layer crystals. Experiments have shown that a higher voltage does, indeed, result. However, the resulting Cu$_x$S layer formed on second layer crystals is not sufficiently deep to capture the incident radiation. This results in a reduced current production. Hence, no overall gain in cell performance is obtained.

Yet another solution is to form a single layer of CdS to a thickness sufficient to permit grain boundary penetration without shorting through the CdS layer. This, of course, would be unacceptable for a backwall configuration CdS cell where incident radiation must pass through the CdS layer to the heterojunction. Even in a front wall configuration, the resulting thickness of CdS would require 5–10 times the CdS thickness needed for photon capture, resulting in a waste of scarce cadmium resources and an increase in overall cell production costs.

These disadvantages of the prior art are overcome by the present invention, however, and an improved fabrication process is provided for forming a CdS layer from a spray process and forming a heterojunction from evaporated copper-containing materials, wherein large CdS crystals are produced on which the heterojunctions are formed to yield improved open circuit voltages and increased photovoltaic conversion efficiencies.

SUMMARY OF INVENTION

In a preferred embodiment of the present invention, a solution containing cadmium is sprayed onto a heated electrically conductive transparent substrate to form a cadmium-containing sulfide. The resulting thin film may preferably be either CdS or Zn$_x$Cd$_{1-x}$S. The size of the spray deposited crystals is increased by heating the resulting film in a controlled atmosphere. The desired growth treatment may be obtained by placing two coated substrates in spaced apart face-to-face relationship, by spacing an uncoated sheet of glass above a coated substrate, or by heating the CdS film in an atmosphere which is rich in cadmium chloride vapors. The resulting crystals preferably have at least one dimension in the range of 1–10 microns.

A copper compound is then vacuum evaporated onto the CdS crystals and a portion of the surface of the CdS crystals is converted to Cu$_x$S by continuing to heat the copper-coated CdS layer during a time-temperature controlled cycle. The desired heat treatment cycle preferably includes a slow rate of temperature increase to the desired temperature, a period of steady state heat treatment, and an abrupt drop in temperature following the cycle. After the Cu$_x$S formation process, the cell is rinsed in de-ionized water to remove residual chlorides and other reaction products.

Finally, electrodes may be applied for interconnecting the cells. Suitable electrodes may be applied by vacuum evaporating contacts of chromium or gold onto the exposed Cu$_x$S surface. In another embodiment, a paste of copper or silver may be applied to the Cu$_x$S surface, forming an electrode when dried. Although vacuum evaporation of a relatively thick layer of copper has been found to be unsuitable, a thin layer of copper, 100–200 Å, followed by a vacuum evaporated chromium layer may be used.

The resulting photovoltaic cell includes CdS crystals having dimensions in the range of 1–10 microns. Junction regions in the order of 0.5–1.0 microns may be formed during the controlled Cu$_x$S formation. Photovoltaic cell efficiencies of up to 7.6% have been achieved using CdS, with Voc of 540 mv and Isc of 19} ma/cm$^2$. Where zinc cadmium sulfide has been used, a Voc of 750 mv has been obtained.

DETAILED DESCRIPTION

GENERAL PROCESS

A process is provided for forming cadmium-type photovoltaic cells having Cu$_x$S heterojunctions. In a preferred embodiment, the process herein described forms either CdS or Zn$_x$Cd$_{1-x}$S films with Cu$_x$S heterojunctions formed thereon, arranged in a backwall configuration on a transparent electrically conductive substrate. Preferably the substrate is glass having an electrically conductive coating of tin oxide formed thereon according to the process set out in U.S. Pat. No. 4,224,355, which disclosure is incorporated herein by reference. The subject patent also discloses a spray process for forming cadmium sulfide films on a moving glass substrate. The process, hereinbelow described, is generally performed using stationary sheets of glass floating on a molten tin bath, although it is anticipated that the solutions hereinafter described could be equally employed in the continuous production process described in the subject patent.

According to the preferred process, a transparent substrate having a film of electrically conductive SnO$_x$ is floated on a molten tin bath with the SnO$_x$ surface exposed. A selected cadmium-containing solution is sprayed onto the heated surface to form a film of cadmium sulfide of zinc cadmium sulfide, the film typically having crystal dimensions in the range of 0.1–1.0 microns. In some cases it has been found beneficial to irradiate the substrate with ultra-violet radiation during the spray pyrolysis to enhance crystal growth.

The resulting crystals are then subject to a regrowth treatment wherein the crystals are heated in a controlled atmosphere. It is desired to increase the crystal sizes by factors of up to at least 10 times. It is believed that the basic regrowth process requires that the crystalline films be heated in an atmosphere containing cadmium chloride (CdCl$_2$) vapors. In one embodiment, the crystal films are placed in face-to-face spaced apart relationship with a sheet of plain glass or with another crystal surface and this relationship is maintained while the sandwich is heated for a time effective to produce the desired crystal sizes.

Following regrowth, the crystal films, now having crystals with dimensions in the range of 1–10 microns are placed inside a vacuum chamber. A prepared cuprous chloride powder is then vacuum evaporated onto the large crystals. The cuprous chloride (CuCl) is then converted to cuprous sulfide (Cu$_x$S) in a subsequent heat treatment step, where X is slightly less than 2. The converting heat treatment may be done in a vacuum system or in an atmosphere of hydrogen and/or nitrogen. The heat treatment step is an important part of the overall process for forming efficient photovoltaic cells wherein the depth of the Cu$_2$S formation on the crystals is controlled to obtain an optimum thickness for absorbing incident radiation. Following the converting heat treatment, the resulting photovoltaic cells are rinsed in de-ionized water or methanol to remove residual chlorides and other reaction products.

The photovoltaic cell produced by the above process now has crystals preferably in the range of 1–2 microns in size wherein the CdS or Zn$_x$Cd$_{1-x}$S layer is only a few crystals thick. The Cu$_x$S forms a substantially planar heterojunction over the crystals, the thickness of the heterojunction being generally optimized for a complete utilization of the incident radiation. Vacuum evaporating cuprous chloride to form the heterojunction in a "dry" or a "solid" state process greatly reduces, and practically eliminates, shorting defects during the heterojunction formation process. Thus, a high production yield of photovoltaic cells is obtained and the large crystal sizes provide increased open circuit voltages. The optimized heterojunction then enables the efficient production of electron flow from the conversion of energy in the incident solar radiation to the movement of charged particles across the heterojunction barrier layer.

Of course, the electrical energy must be removed from the photovoltaic cell and electrodes are applied to the Cu$_x$S layer for that purpose. In one embodiment, chromium or gold electrodes may be vacuum evaporated onto the surface. From cost considerations, chromium is preferred to gold. Alternatively, a silver paste or copper paste may be brushed or rolled onto the Cu$_x$S surface to form the covering electrode. Again, the copper paste is preferred over the silver paste from cost considerations. It should be noted that vacuum evaporating thick copper electrodes over the Cu$_x$S has not obtained photovoltaic cells with the desired operating parameters. However, a very thin layer (about 150 Å) of copper may be vacuum evaporated, followed by a layer of chromium. The thin copper layer may improve the overall stoichiometry of the Cu$_x$S to improve the short circuit current density of the cells.

It has been found that the crystalline layer of CdS or Zn$_x$Cd$_{1-x}$S layer may not always adhere tightly to the electrically conductive layer of tin oxide. If this occurs, it is possible to improve the adherence between the two layers by forming an intermediate layer of cadmium sulfide containing aluminum, such as formed by the solutions taught in U.S. Pat. No. 4,224,355. Such an intermediate layer should be quite thin, about 0.3 microns, to minimize the impact of the layer on cell performance. The aluminum apparently keeps the CdS crystals in the intermediate layer from growing during the subsequent cell regrowth treatments and the small crystals adhere well to the SnO$_x$ and to the overlying regrown crystals.

Other remedial treatments are available for photovoltaic cells which do not have the desired characteristics after completing the above process. One remedial treatment performed when the electroding process results in poor electrical shunt resistance, involves subjecting the degraded cell to incident radiation equivalent to "one sun" while maintaining the cell at about 55° C.

Preferred Process Parameters and Effects of Parametric Variations

The above process description generally describes the process steps required to practice the invention herein described. Certain process parameters are preferred over others and certain combinations of process parameters appear to produce superior results. Such parameters and combination of parameters are hereinbelow described for the purpose of presenting various embodiments of the present invention.

Spray Process

A transparent vitreous substrate, such as glass, coated with a transparent electrically conductive coating, such as SnO$_x$, is placed on a molten bath of tin heated to establish the exposed electrically conductive surface at about 342° C. The following spray solutions produce acceptable crystalline films:
(All solutions are in de-ionized water).

EXAMPLE I

The following process yields a CdS layer about 2.9 microns in thickness:

| Solution | |
|---|---|
| Thiourea = | 0.137 M |
| $InCl_3$ = | $4.2 \times 10^{-5}$ M |
| $CdCl_2 \cdot 2\frac{1}{2}H_2O$ = | 0.11 M |

| Spray Parameters | |
|---|---|
| Substrate Temp. | 346° C. |
| Flow rate | 18 cc/min. for 10 min. |
| | 36 cc/min. for 28 min. |
| Atomizing Pressure | 20 psi |
| Exposed to UV radiation while spraying | |

EXAMPLE II

The following process yields a total CdS film thickness of about 3.8 microns:

| First Layer | | Second Layer | |
|---|---|---|---|
| Solution | | | |
| Thiourea = | 0.137 M | Thiourea = | 0.137 M |
| $CdCl_2 \cdot 2\frac{1}{2}H_2O$ = | 0.11 M | $ZnCl_2$ = | 0.005 M |
| | | $CdCl_2 \cdot 2\frac{1}{2}H_2O$ = | 0.11 M |
| Spray Parameters | | | |
| Substrate Temp. | 337° C. | Substrate Temp. | 337° C. |
| Flow rate | 18 cc/min. for 5 min. | Flow rate | 18 cc/min. for 5 min. |
| | 36 cc/min. for 20 min. | | 36 cc/min. for 10 min. |
| Atomizing Pressure | 20 psi | Atomizing Pressure | 20 psi |

EXAMPLE III

The following example forms a first layer of CdS about 0.3 microns thick and a second CdS layer about 1.8 microns thick.

| Solution | | | |
|---|---|---|---|
| First Layer | | Second Layer | |
| Thiourea = | 0.1 M | Thiourea = | 0.1 M |
| $AlCl_3 \cdot 6H_2O$ = | 0.022 M | $CdCl_2 \cdot 2\frac{1}{2}H_2O$ = | 0.08 M |
| $CdCl_2 \cdot 2\frac{1}{2}H_2O$ = | 0.08 M | | |
| Spray Parameters | | | |
| | First Layer | | Second Layer |
| Substrate Temp. | 337° C. | | 337° C. |
| Flow rate | 18 cc/min. for 3 min. | | 18 cc/min. for 3 min. |
| | 36 cc/min. for 3 min. | | 36 cc/min. for 3 min. |
| Atomizing Pressure | 20 psi | | 20 psi |

In the above examples, the first solution example forms a film of CdS having a small quantity of indium provided for doping the film to improve its semiconductor properties. The second example produces a layer of cadmium sulfide with an overlying layer of zinc cadmium sulfide, $Zn_xCd_{1-x}S$. The third example utilizes a first thin layer to improve the adherence of the CdS layer to the layer of $SnO_x$. For ease of reference, the crystal layer will be referred to as the layer of CdS, although it will be understood to include both CdS and $Zn_xCd_{1-x}S$ crystal films.

It is possible to vary the parameters forming the CdS film. As hereinabove mentioned, an additional layer of CdS containing large quantities of aluminum may be provided for enhancing the adhesion between the tin oxide layer and the CdS layer. This thin (about 0.3 microns) aluminum-containing layer is preferably deleted in order to maximize overall cell performance. In some instances, it has been found desirable to irradiate the substrate with ultra-violet lamps during the film forming process. The ultra-violet irradiation is believed to add energy during the crystal forming process to assist in crystal formation, enhancing the uniformity of crystal size and orientation.

In yet another parameter variation, the molar concentration of cadmium chloride may be varied. It has been found that relatively weak concentrations of cadmium chloride of about 0.01 M/l (moles/liter) yield crystal films from which operable cells may be formed. However, it has been found that the Voc of cells produced from crystal films formed using higher concentrations increases as a function of concentration. The higher concentrations also facilitate the rate at which film formation occurs. Thus, concentrations of 0.10-0.11 M/l are preferred, and even higher concentrations may be used up to the solubility limit of the sulfur-containing compound.

The thickness of the CdS layer has an effect on overall cell efficiency. Generally, a CdS layer thickness of at least 0.5-1.0 micron is practically required to accommodate the $Cu_xS$ and the junction region formed by the $Cu_xS$. On the other hand, optical transmission degradation affects overall efficiency by limiting the amount of incident radiation which reaches the heterojunction. Hence, the desired thickness of CdS is in the range of 1-6 microns. More particularly, a CdS layer thickness of 2-4 microns can accommodate regrown single crystals in perhaps a single layer, or only a few layers. Single crystalline layers are desirable for optimizing the photovoltaic conversion efficiency of the cell.

In one of the above solutions, indium has been added as a dopant to improve the performance of the CdS. The indium in the trace quantities of a dopant acts to improve the electrical characteristics of the CdS, although at an increase in overall production costs. Doping is not usually required where zinc cadmium sulfide is the crystalline layer. The addition of dopants to CdS-type photovoltaic cells is generally known and the dopant provides substantially the same improvements in the present cells as in other CdS cells.

One particular parameter herein involved is forming a zinc cadmium sulfide crystal layer by a spray process. The resulting crystal structure is generally similar to that of CdS. However, the addition of zinc improves the theoretical open circuit voltage which is attainable from the photovoltaic cell. In fact, as hereinafter reported, open circuit voltages of up to 0.75 volts have been observed for zinc cadmium sulfide ($Zn_xCd_{1-x}S$) films, in comparison with open circuit voltages of about 0.56 volts for cadmium films. The combination spray process with evaporated junction formation appears to provide greater open circuit voltages than heretofore observed. Film compositions having $[0.04 < x < 0.4]$ appear to define the region suitable for photovoltaic cells.

Cadmium nitrate or cadmium acetate may be used in the spray solution to replace cadmium chloride for forming the three "sandwiches" illustrated in Examples 1-3. When a water soluble salt other than cadmium chloride is used, it is desirable to provide a thin top layer from a solution containing cadmium chlorides. The cadmium chloride assists in crystal regrowth, as hereinafter discussed.

Other spray parameters have been varied successfully as follows:

1. Sulfur in excess of stoichiometric quantities up to 100% (25% preferred).
2. Prespray substrate temperature in the range of 280°–380° C. (330°–350° C. preferred).
3. Atomizing pressures in the range of 15–40 psi (20 psi preferred).

Cell Regrowth

The crystalline film produced during the spray process is generally comprised of small crystallites, typically having dimensions less than 0.1 micron. It is desired to increase the crystal sizes by 10–100 times. In a preferred embodiment, this cell regrowth is obtained by subjecting the crystalline films to a heat treatment conducted in a controlled atmosphere, wherein the atmosphere contains cadmium chloride vapor. The cadmium chloride vapor produces a re-crystallization of the film to produce the desired crystal growth.

In a preferred regrowth treatment, two substrates having crystalline films formed thereon are spaced apart a few thousandths of an inch, with the crystal films in a face-to-face relationship. This sandwich is then placed in a muffle furnace for uniformly heating the sandwich to a temperature of about 525° C. within a short period of time (20–25 minutes). A temperature within the range of 425° C. to 600° C. may be used, with the preferred range being 500°–550° C. This heat treatment is preferably maintained for about 58 minutes. Following the heating, the sandwich is cooled over a period of hours.

Alternatively, the sandwich may be placed on a belt furnace for a heated cycle time of about 48 minutes, including about 27 minutes in a temperature range of 400°–490° C. In both heat cycles, the sandwich may be formed from a plain substrate and a coated substrate, rather than a pair of coated substrates. Where a regrowth sandwich is provided, the desired cadmium chloride vapors evolve from the film itself. Hence, one of the films includes cadmium chloride.

The cadmium chloride atmosphere may also be obtained by introducing cadmium chloride adjacent the CdS layer on the substrate. The coated substrate may be placed within an enclosure having an internal coating of cadmium chloride. The enclosure may then be heated in a muffle furnace or belt furnace, wherein cadmium chloride vapors are produced from the enclosure coating. Of course the substrate may be heated in a closed furnace and cadmium chloride vapors introduced into the furnace.

CuCl Evaporation

After the crystals have been regrown to the desired size, copper chloride (CuCl) is then vacuum deposited over the crystals. In a preferred process, an amount of copper chloride is prepared effective to form a layer of CuCl at least 0.1 microns thick and preferably about 0.5–1.0 microns thick on the crystalline layer. The CuCl powder is bleached in a dilute hydrochloric acid solution, typically about a 10% solution, and rinsed in acetone. This powder is placed in an alumina crucible beneath a ball of copper wool and loaded into a vacuum chamber. A vacuum of about $5 \times 10^{-6}$ torr is produced and the coated substrates are heated to a temperature of about 90° C., although acceptable results are obtained over a wide range of temperatures and pressures. The CuCl powder is then evaporated and passes through the copper wool onto the exposed substrate surfaces.

Post Heat Treatment

Once the CuCl layer has been formed, the cuprous chloride must react with the cadmium sulfide to form $Cu_xS$. This is preferably done in the vacuum chamber following CuCl deposition. The substrate temperature may be raised to a temperature in the range of 190° C.–230° C. over a time interval of 11–20 minutes, based on the thickness of CuCl and the time needed to drive the reaction to completion. The resulting thickness of $Cu_xS$ is about 0.5–1.0 microns, a thickness which is sufficient to absorb the incident radiation. Following the heating cycle, it is desirable to terminate the reaction promptly.

In a production system, it may be desirable to remove the substrate from the vacuum system once the CuCl has been evaporated. An alternate post heat treatment may then be performed in yet another vacuum oven at a vacuum of about 300 microns pressure or in an atmosphere of hydrogen and nitrogen and heated at about 185° C. for about 18 minutes. It appears that heat treatment in air is not desirable.

The heat treatment cycle is an important element in maximizing the current density which may be obtained from the completed photovoltaic cell. The time-temperature cycles which have been examined suggest certain effects on cell performance and the cycle is generally optimized with respect to the characteristics of the underlying CdS, e.g., CdS thickness and porosity.

The substrate may be heated to a temperature in the range of 90° C. $<T<$ 300° C. $Cu_xS$ undergoes a phase change which appears to become irreversible when heated to T $>$ 300° C., which would produce unacceptable results. It has been found that the most efficient cells are obtained where T $<$ 250° C. is maintained.

As hereinabove noted, the preferred thickness of $Cu_xS$ is 0.5–1.0 microns. The amount of CuCl deposited is selected to form the preferred layer thickness after all of the CuCl has reacted at the selected temperature and after the selected time. Under optimized conditions, the heat cycle is terminated just as the CuCl is reacted so that no additional thickness of CdS is required to accomodate $Cu_xS$ diffusion through the layer.

Electrode Formation

Following the post heat treatment, the photovoltaic cells are then rinsed to remove residual chlorides and other reaction products. In a preferred rinse cycle, the cells are rinsed in de-ionized water, methanol, again in de-ionized water, and then dried.

In one embodiment, metallic electrodes are vacuum evaporated over the entire $Cu_xS$ surface. Chromium or gold has been successfully used to obtain the increased efficiencies produced by the large crystal cells. Chromium is preferred over gold because of the high cost of gold. Vacuum evaporation of a thick copper electrode has not produced cells having the desired performance characteristics, although it may be possible to use a thin copper layer (about 150 Å thick) with chromium evaporated over the copper.

In an alternate embodiment, a metallic paste may be applied directly to the $Cu_xS$ surface by brushing, rolling, or other suitable application, which dries to form an adherent, metallic, and electrically conductive coating. A commercial silver paste (e.g. DuPont composition 4929 and "Tecknit" Model ACRYLIC-1) and a copper epoxy (e.g. Ablebond 163-4) have been successfully applied. Again, the copper composition is preferred over the silver composition from cost considerations.

Ancillary Process Steps

Some photovoltaic cells exhibit a reduced shunt resistance after the electroding step. It has been found that the poor shunt resistance can be improved to acceptable levels, in some instances, by subjecting the cells to incident irradiation equivalent to "one sun" while heating the cells to 55° C. Treatment for about 15 minutes under these conditions will effect the desired improvement, if such improvement is to be obtained.

As hereinabove noted, it may also be desirable to increase the adhesion between the active CdS layer and the underlying layer of $SnO_x$. This may be done by forming a very thin layer, about 0.3 microns thick, of CdS having the small crystal sizes generally described for the first layer in U.S. Pat. No. 4,159,914. The process and the aluminum containing solutions described in that patent have been successfully used to obtain the improved adhesion. If adequate adhesion does not occur, the CdS layer can separate from the underlying $SnO_x$ during rinse cycles and during subsequent processing and supplying solar panel modules framed for field installation.

Using the above processes, a photovoltaic cell may be produced having optimized layer thicknesses since the production of each layer is carefully controlled. In a backwall cell configuration, incident radiation passes through the heterojunction and into the $Cu_xS$ for absorption and electron generation. Charge flow across the voltage barrier at the heterojunction produces the useful energy from the electron generation.

Where planar layers are provided in a backwall configuration, a preferred embodiment of the present invention includes a transparent vitreous substrate, a transparent electrically conductive coating of $SnO_x$ formed thereon, a film of crystalline CdS having crystal dimensions of at least 0.5 microns and being 0.5–1.0 micron thick, a very thin layer of $Zn_xCd_{1-x}S$ overlying the CdS and having crystal dimensions at least 0.5 microns, a layer of $Cu_xS$ having a thickness of 0.5–1.0 microns forming a heterojunction with the $Zn_xCd_{1-x}S$, and an overlying electrode layer. In this configuration, the $Zn_xCd_{1-x}S/Cu_xS$ provides the electron energy band gaps and the improved match in crystal lattice constants to produce a high Voc.

Improvements in Isc are obtained from a thick layer of $Cu_xS$ and a thin layer of CdS having low resistivity. The thick layer of $Cu_xS$ can be provided only in a backwall configuration. In a frontwall configuration, a thick $Cu_xS$ layer would absorb the incident radiation wherein the generated electrons would have a substantial probability of recombining before reaching the heterojunction. Thus, a $Cu_xS$ thickness of greater than 0.3 microns is generally unacceptable for a frontwall cell. However, a $Cu_xS$ layer more than 0.5 microns thick is required for complete light absorption. These problems do not occur in backwall configurations where the bulk of the electrons is generated adjacent the heterojunction and more complete light absorption is obtained.

The $Zn_xCd_{1-x}S/Cu_xS$ heterojunction forms the barrier layer voltage which is desired. However, $Zn_xCd_{1-x}S$ has a high resistivity which provides a low short circuit current and a wide depletion layer adjacent the heterojunction. The layer thickness required to accommodate the depletion layer further aggravates the high resistivity problem.

Accordingly, it is preferred to maintain only a relatively thin layer of $Zn_xCd_{1-x}S$ and to provide a layer of CdS beneath the $Zn_xCd_{1-x}S$. The large crystals formed herein act to provide CdS with relatively low resistivity and a corresponding increased Isc and reduced depletion layer width. A CdS layer thickness of 0.5–1.0 micron is adequate to accommodate the resulting depletion layer and also accommodate some grain boundary penetration by CuCl during $Cu_xS$ formation. Minimizing the CdS layer thickness also places the heterojunction in close proximity to the $SnO_x$ to further reduce resistance losses in the CdS layer.

It is therefore apparent that the present invention is one well adapted to attain the improvements hereinabove set forth, together with other improvements and advantages which will become obvious and inherent from a description of the process itself. It will be understood that certain combinations and subcombinations of the process are of utility and may be employed without reference to other features and subcombinations for fabricating cadmium sulfide-type photovoltaic cells. This is contemplated by and is within the scope of the present invention.

As many possible embodiments may be made of this invention without departing from the spirit or scope thereof, it is understood that all matters hereinabove set forth are to be intrepreted as illustrative and not in any limiting sense.

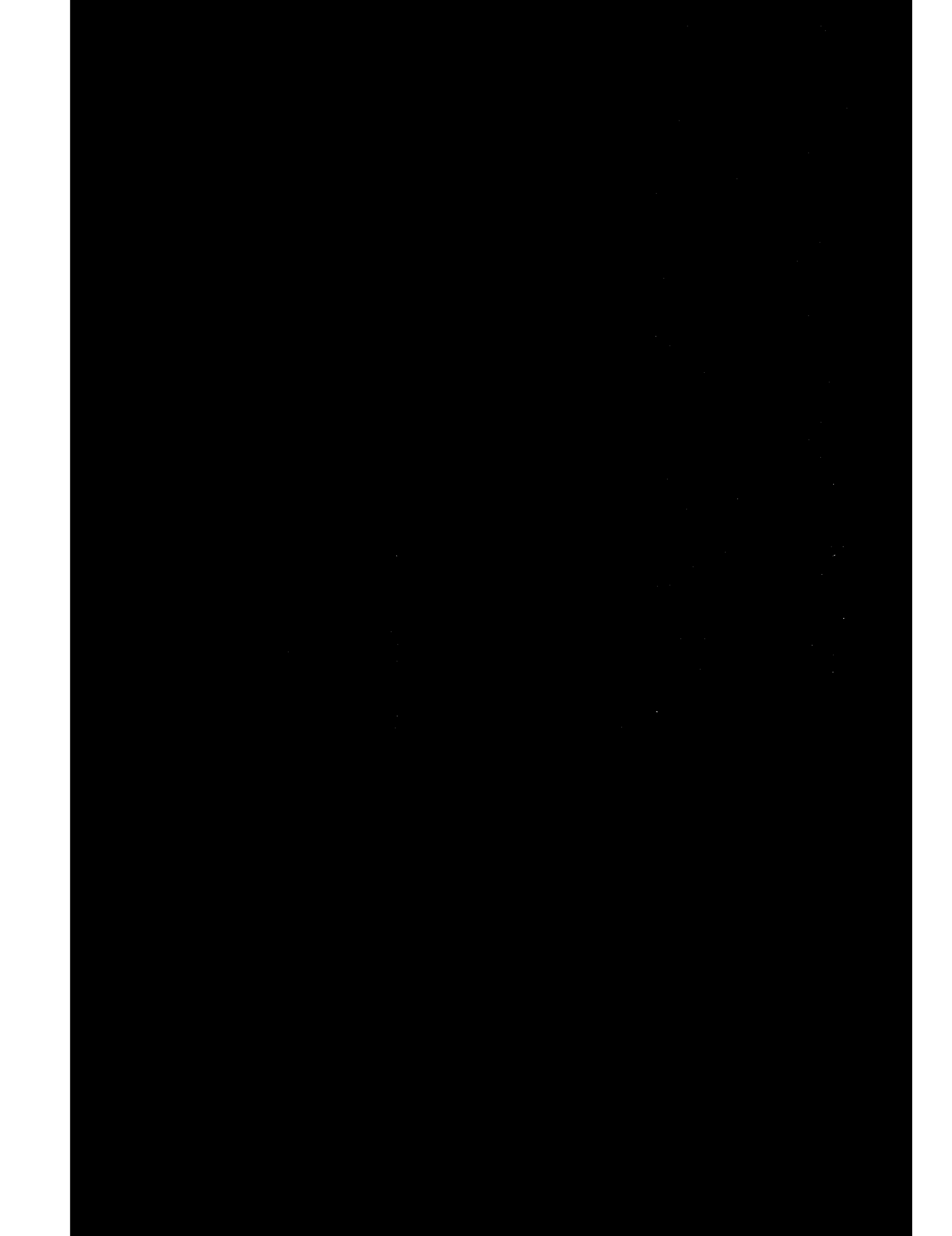

What is claimed is:

1. A process for forming photovoltaic cells, comprising:
    spraying onto a heated electrically conductive film of $SnO_x$ on a transparent vitreous substrate at least one solution effective to form a crystalline film containing cadmium and sulphur,
    exposing said crytalline film to a heated vapor effective to recrystallize said crystalline film to form crystals having at least one dimension greater than 0.5 microns,
    vacuum evaporating a copper chloride layer onto said recrystallized film, and
    heating to convert a portion of said recrystallized film to $Cu_xS$ to a thickness between about 0.5 to 1.0 microns, thereby forming a heterojunction and associated depletion layer with a remaining portion of said recrystallized film,
    said remaining portion having a thickness effective to separate said depletion layer from said electrically conductive film.

2. A process according to claim 1, further including:
    forming at least a portion of said crystalline film from CdS.

3. A process according to claim 2, further including:
    forming an adherent film to a thickness less than 0.3 micron adjacent said substrate film of $SnO_x$ having an aluminum content effective to adhere to said film of $SnO_x$ and said portion of said crystalline film of CdS, and
    forming said crystalline film over said adherent film.

4. A process according to claim 2, further including:
    forming a first portion of said crystalline film adjacent said substrate from CdS, and